(12) United States Patent
Ahn et al.

(10) Patent No.: US 11,069,584 B2
(45) Date of Patent: Jul. 20, 2021

(54) INSPECTION METHOD FOR MICRO LED

(71) Applicant: POINT ENGINEERING CO., LTD., Asan (KR)

(72) Inventors: Bum Mo Ahn, Suwon (KR); Seung Ho Park, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 305 days.

(21) Appl. No.: 16/370,584

(22) Filed: Mar. 29, 2019

(65) Prior Publication Data

US 2019/0304853 A1    Oct. 3, 2019

(30) Foreign Application Priority Data

Mar. 29, 2018 (KR) .................. 10-2018-0036865

(51) Int. Cl.
| | | |
|---|---|---|
| *G01R 31/00* | (2006.01) | |
| *H01L 21/66* | (2006.01) | |
| *G01R 31/26* | (2020.01) | |
| *G01R 31/44* | (2020.01) | |
| *G01R 31/52* | (2020.01) | |
| *H01L 25/075* | (2006.01) | |
| *H01L 25/16* | (2006.01) | |
| *G09G 3/00* | (2006.01) | |
| *G09G 3/3233* | (2016.01) | |

(52) U.S. Cl.
CPC ............ *H01L 22/14* (2013.01); *G01R 31/006* (2013.01); *G01R 31/2607* (2013.01); *G01R 31/2635* (2013.01); *G01R 31/2642* (2013.01); *G01R 31/44* (2013.01); *G01R 31/52* (2020.01); *H01L 22/22* (2013.01); *G09G 3/006* (2013.01); *G09G 3/3233* (2013.01); *H01L 25/0753* (2013.01); *H01L 25/167* (2013.01)

(58) Field of Classification Search
CPC .... G01R 31/44; G01R 31/2635; G01R 31/52; G01R 31/006; G01R 31/2642; G01R 31/2607; G01R 31/2601; G01R 31/27; G09G 3/006; G09G 3/3233; H01L 22/14; H01L 22/22; H01L 25/0753; H01L 25/167; H01L 33/0095; H01L 27/15; H01L 22/20
USPC ................... 324/57, 378, 403, 414
See application file for complete search history.

(56) References Cited

U.S. PATENT DOCUMENTS

| | | | |
|---|---|---|---|
| 2017/0221399 A1* | 8/2017 | Yan ..................... | G09G 3/2003 |
| 2019/0304854 A1* | 10/2019 | Ahn ....................... | H01L 22/22 |
| 2020/0403123 A1* | 12/2020 | Jang ..................... | H01L 33/385 |

FOREIGN PATENT DOCUMENTS

KR    100731673 B1    6/2007

\* cited by examiner

*Primary Examiner* — Raul J Rios Russo

(57) ABSTRACT

The present invention relates to an inspection method for a micro LED, the method being configured to inspect whether the micro LED is defective.

5 Claims, 6 Drawing Sheets

INSPECTION METHOD FOR MICRO LED

CROSS REFERENCE TO RELATED APPLICATION

The present application claims priority to Korean Patent Application No. 10-2018-0036865, filed Mar. 29, 2018, the entire contents of which is incorporated herein for all purposes by this reference.

BACKGROUND OF THE INVENTION

Field of the Invention

The present invention relates to an inspection method for a micro LED, the method being configured to inspect whether the micro LED is defective.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. Liquid crystal and organic materials are the core materials of LCDs and OLEDs, respectively, whereas the micro LED display uses 1 µm to 100 µm of an LED chip itself as a light emitting material.

Since the term "micro LED" emerged in a patent "MICRO-LED ARRAYS WITH ENHANCED LIGHT EXTRACTION" in 1999 (Korean Patent No. 10-0731673) disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

With regard to the transfer of the micro LED device to the display substrate, as the LED size is reduced to 1 µm to 100 µm, it is impossible to use a conventional pick-and-place machine, and a technology of a transfer head for higher precision has been developed.

In particular, along with the micro LED transfer technology as described above, there has been a need to develop a method for detecting a defective micro LED that may occur during the transfer of micro LEDs.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-0731673

SUMMARY OF THE INVENTION

Accordingly, the present invention has been made keeping in mind the above problems occurring in the related art, and an objective of the present invention is to provide an inspection method for a micro LED, the method being configured to inspect whether the micro LED is defective through a simple inspection.

In order to achieve the above objective, according to one aspect of the present invention, there is provided an inspection method for a micro LED, the method including: sequentially inspecting first to m-th rows of micro LEDs; sequentially inspecting first to n-th columns of the micro LEDs; and determining positional coordinates of a defective micro LED through the inspecting of the first to m-th rows and the first to n-th columns of the micro LEDs.

In the inspecting of each of the first to m-th rows or each of the first to n-th columns of the micro LEDs, when an inspection signal is an 'on' signal, it may be determined that only normal micro LEDs exist in the each row or the each column.

In the inspecting of each of the first to m-th rows or each of the first to n-th columns of the micro LEDs, when an inspection signal is an 'off' signal, it may be determined that at least one defective micro LED exists in the each row or the each column.

When an inspection signal of each row is an 'off' signal and an inspection signal of each column is an 'off' signal, it may be determined that all of the micro LEDs at corresponding positional coordinates are defective micro LEDs.

When an inspection signal of each row is an 'off' signal and an inspection signal of each column is an 'off' signal, the micro LEDs at corresponding positional coordinates may be re-inspected.

As described above, an inspection method for a micro LED according to the present invention has the following effects.

Through the inspection method for the micro LED according to the present invention, it is possible to determine whether the micro LEDs are defective even by a very small number of inspections and a simple inspection.

Defective micro LEDs are precisely re-inspected by an individual inspection apparatus, whereby it is possible for the micro LEDs that cannot be determined for defects by a line inspection apparatus to be re-inspected and determined as normal micro LEDs. Thus, it is possible to more precisely determine defective micro LEDs and normal micro LEDs.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
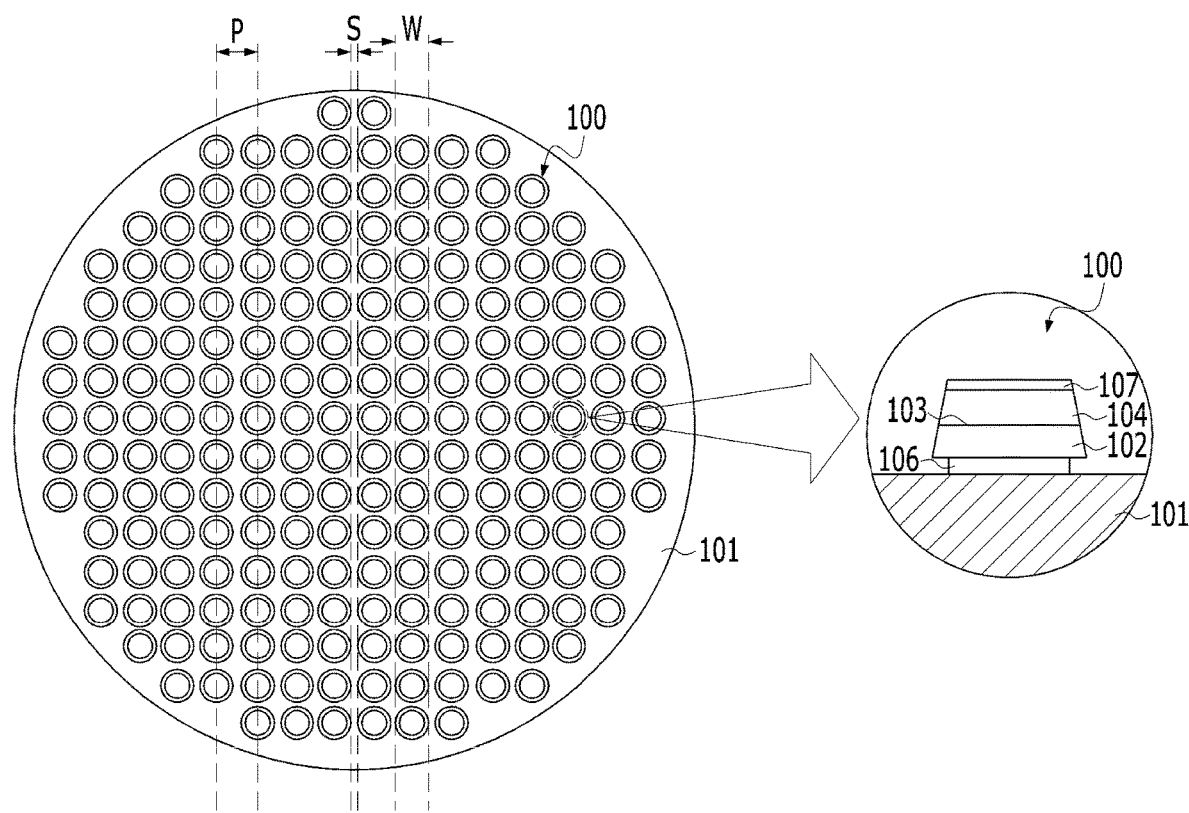
FIG. 1 is a view illustrating a micro LED, which is an object to be inspected according to the present invention, is formed on a growth substrate.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specifically listed exemplary embodiments and conditions.

The above and other objectives, features, and advantages of the present invention will be more clearly understood from the following detailed description taken in conjunction with the accompanying drawings, and accordingly the invention can be easily embodied by one of ordinary skill in the art to which this invention belongs.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, an exemplary embodiment of the present invention will be described in detail with reference to the accompanying drawings.

FIG. 1 is a view illustrating a micro light-emitting diode (micro LED), which is an object to be inspected according to the present invention, is formed on a growth substrate.

A micro LED 100 is fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

The micro LED 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may include an n-type semiconductor layer, and the second semiconductor layer 104 may include a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

Multiple micro LEDs 100 formed on the growth substrate 101 are separated into individual pieces by cutting along a cutting line using a laser or the like or by etching. Then, it is possible to separate the individual pieces of the micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
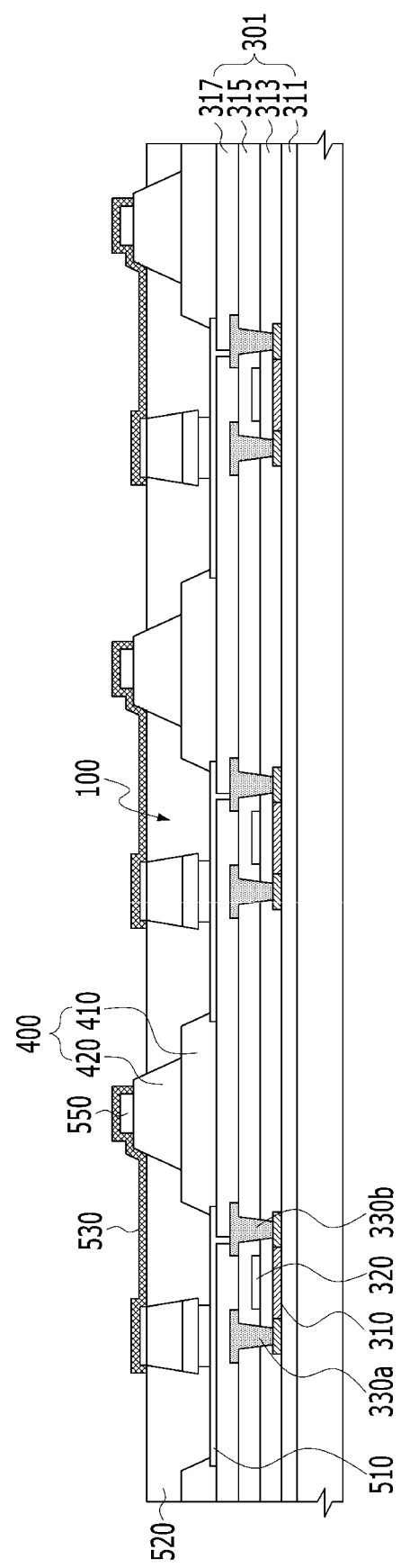
FIG. 2 is a view illustrating a micro LED structure in which micro LEDs, which are objects to be inspected according to the present invention, are mounted on a display substrate.

FIG. 2 is a view of a micro LED structure in which the micro LEDs, which are objects to be inspected according to the present invention, are mounted on a display substrate.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and thus have solubility. The plastic material may be an organic substance selected from among the group consisting of polyethersulfone (PES), polyacrylate (PAR), polyetherimide (PEI), polyethyelenen napthalate (PEN), polyethyeleneterepthalate (PET), polyphenylene sulfide (PPS), polyarylate, polyimide, polycarbonate (PC), cellulose triacetate (TAC), and cellulose acetate propionate (CAP) that are organic insulating substances.

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 by using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign substances or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate insulating layer 313 is formed on the active layer 310. The gate insulating layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride ($SiON$), aluminum oxide ($Al_2O_3$), titanium dioxide ($TiO_2$), tantalum pentoxide ($Ta_2O_5$), hafnium dioxide ($Hf_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS), a polymer derivative having phenols, polyacrylates, polyimides, poly(aryl ethers), polyamides, fluoropolymers, poly-p-xylenes, and polyvinyl alcohols, and a combination thereof. In addition, the planarization layer 317 may be formed into a multi-stack including an inorganic dielectric layer and an organic dielectric layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where the micro LED 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like of a display device. In an embodiment, the micro LED 100 may be greater in height than the first bank layer 410. The recess may have a quadrangular cross-section, but is not limited to this. The recess may have various cross-sectional shapes, such as polygonal, rectangular, circular, conical, elliptical, and triangular.

The bank layer 400 may further include a second bank layer 420 on the first bank layer 410. The first bank layer 410 and the second bank layer 420 have a step difference, and the second bank layer 420 may be smaller in width than the first bank layer 410. A conductive layer 550 may be disposed on the second bank layer 420. The conductive layer 550 may be disposed in a direction parallel to a data line or a scan line, and may be electrically connected to a second electrode 530 However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode with which pixels P share each other. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

As an example, the first bank layer 410 and the second bank layer 420 may be made of a thermoplastic resin such as a polycarbonate (PC) resin, a polyethylene terephthalate (PET) resin, a polyethersulfone resin, a polyvinyl butyral resin, a polyphenylene ether resin, a polyamide resin, a polyetherimide resin, a norbornene system resin, a methacrylate resin, and a cyclic polyolefin resin, a thermosetting resin such as an epoxy resin, a phenol resin, a urethane resin, an acrylic resin, a vinyl ester resin, an imide resin, a urea resin, and a melamine resin, or an organic insulating substance such as polystyrene, polyacrylonitrile, polycarbonate, but are not limited thereto.

As another example, the first bank layer 410 and the second bank layer 420 may be made of an inorganic insulating substance such as inorganic oxide and inorganic nitride including SiOx, SiNx, SiNxOy, AlOx, TiOx, TaOx, and ZnOx, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

The micro LED 100 is disposed in the recess portion. The micro LED 100 may be electrically connected to the first electrode 510 at the recess portion.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recesses of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive material such as ITO, IZO, ZnO, and $In_2O_3$.

Inspection Method for a Micro LED 100 According to an Embodiment of the Present Invention Hereinbelow, an inspection method for a micro LED 100 according to an embodiment of the present invention will be described with reference to FIGS. 3 to 5C.

The inspection method for the micro LED 100 according to the embodiment of the present invention, which is an inspection method for micro LEDs 100 arranged in n rows and m columns, is performed in a manner that first to m-th rows of the micro LEDs 100 are sequentially inspected, first to n-th rows of the micro LEDs 100 are sequentially inspected, and the positional coordinates of a defective micro LED 100 are determined through the row inspection and the column inspection. In this case, n and m are integers greater than two.

The inspection method for the micro LED 100 according to the embodiment of the present invention is performed where the micro LEDs 100 are arranged in m rows and n columns.

In other words, if the micro LEDs 100 are arranged in m rows and n columns, any one of the micro LEDs 100 that are formed on the growth substrate 101, the micro LEDs 100 that are mounted on the display substrate 301, and the micro LEDs 100 that are gripped on a transfer head is subjected to inspection.

Figure 3:
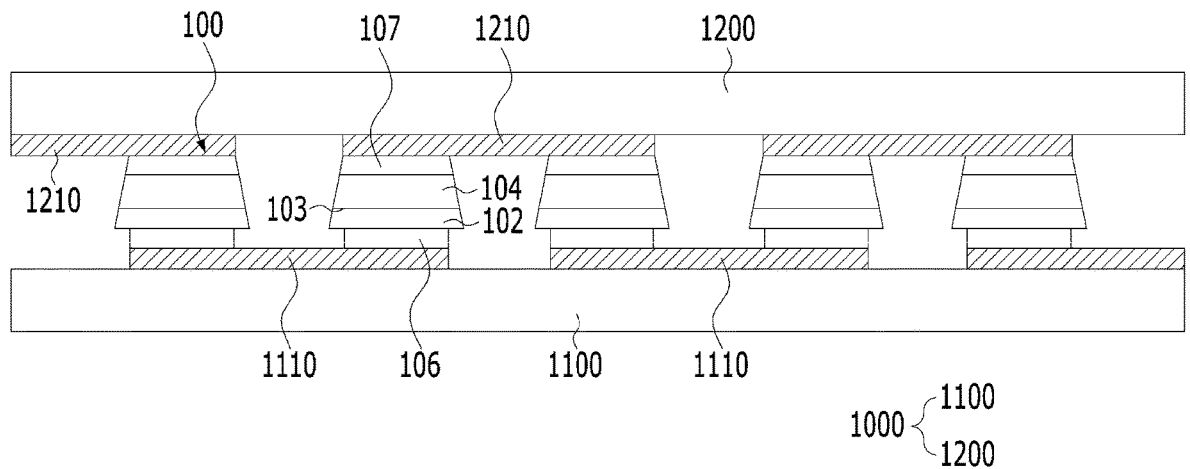
FIG. 3 is a view illustrating an inspection apparatus and the micro LEDs in the case where first and second contact electrodes are provided on opposite sides of each of the micro LEDs.
Figure 4:
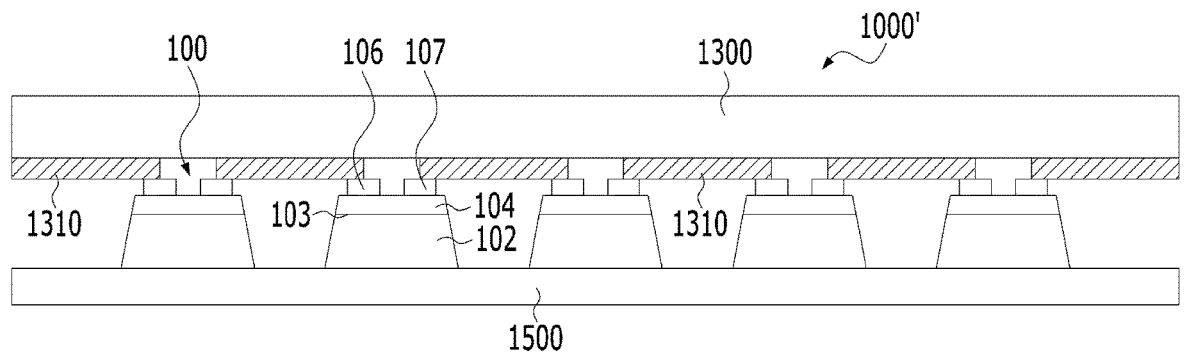
FIG. 4 is a view illustrating an inspection apparatus and the micro LEDs in the case where the first and second contact electrodes are provided on one side of each of the micro LEDs.

The inspection of the micro LEDs 100 is performed by inspection apparatuses 1000 and 1000' shown in FIGS. 3 and 4.

The inspection apparatuses 1000 and 1000' are configured as line inspection apparatuses for inspecting the micro LEDs 100 arranged in m rows and n columns for each row and each column.

The inspection apparatuses 1000 and 1000' may have different configurations depending on the positions of first and second contact electrodes 106 and 107 of the micro LED 100.

First, an example of the inspection apparatus 1000 in which the first and second contact electrodes 106 and 107 are respectively formed on opposite sides of each of the micro LEDs 100, that is, on a lower portion and an upper portion of the micro LED 100 will be described with reference to FIG. 3.

FIG. 3 is a view illustrating an inspection apparatus and the micro LEDs in the case where the first and second contact electrodes are provided on opposite sides of each of the micro LEDs.

In the case where the first and second contact electrodes are provided on the opposite sides each of the micro LEDs, the inspection apparatus 1000 for inspecting whether the micro LEDs 100 are defective includes a first substrate 1100 located under the micro LEDs 100 and a second substrate 1200 located over the micro LEDs 100.

Each first electrode 1110 is provided on an upper surface of the first substrate 1100 so as to be in contact with lower surfaces of first contact electrodes 106 of adjacent ones of the micro LEDs 100.

The first electrode 1110 that is in contact with the first contact electrodes 106 of the adjacent ones of the micro LEDs 100 serves to allow electricity to flow between the first contact electrodes 106 of the adjacent ones of the micro LEDs 100 when electricity is applied to the inspection apparatus 1000.

Each second electrode 1210 is provided on a lower surface of the second substrate 1200 so as to be in contact with upper surfaces of second contact electrodes 107 of the adjacent ones of the micro LED 100s.

The second electrode 1210 that is in contact with the second contact electrodes 107 of the adjacent ones of the micro LEDs 100 serves to allow electricity to flow between the second contact electrodes 107 of the adjacent ones of the micro LEDs 100 when electricity is applied to the inspection apparatus 1000.

The respective first electrodes 1110 and the respective second electrodes 1210 are alternately arranged on the upper and lower sides of the micro LEDs 100 with respect to the micro LEDs 100.

The inspection apparatus 1000 having the above-described configuration inspects whether the micro LEDs 100 are defective in response to application of electricity to the inspection apparatus 1000.

In detail, to inspect the micro LEDs 100, the micro LEDs 100 are placed on the upper side of the first substrate 1100.

The first substrate 1100 may be the growth substrate 101 or the display substrate 301 described above or a carrier substrate on which the micro LEDs 100 are temporarily attached. Alternatively, the first substrate 1100 may be the transfer head. In this case, FIG. 3 is regarded as an inverted view.

The micro LEDs 100 are arranged in m rows and n columns such that the first contact electrodes 106 of the respective adjacent ones of the micro LEDs 100 are in contact with the second electrodes 1210.

Thereafter, the second substrate 1200 is lowered, and the second electrodes 1210 are brought into contact with the second contact electrodes 107 of the respective adjacent ones of the micro LEDs 100.

As described above, when the first and second contact electrodes 106 and 107 of each of the micro LEDs 100 are brought into contact with the first electrode 1110 and the second electrode 1210, respectively, and when the micro LEDs 100 are interposed between the first and second substrates 1100 and 1200, electricity is applied to a first end of the inspection apparatus 1000.

If all of the micro LEDs 100 on the inspection apparatus 1000 are normal, electricity sequentially repeatedly flows to the second electrodes 1210, the second contact electrodes 107, the first electrodes 1110, the first contact electrodes 106, and the second electrodes 1210, and electricity also flow to a second end of the inspection apparatus 1000, whereby all of the micro LEDs 100 are determined as normal products.

If at least one of the micro LEDs 100 on the inspection apparatus 1000 is defective, electricity does not flow. Accordingly, no electric current flows to the second end of the inspection apparatus 1000, whereby it is possible for the inspection apparatus 1000 to determine that a defective micro LED 100 exists in one column or one row.

Hereinbelow, an example of the inspection apparatus 1000' in the case where the first and second contact electrodes 106 and 107 are formed on one side, that is, on the upper side of the micro LED 100, will be described with reference to FIG. 4.

FIG. 4 is a view illustrating an inspection apparatus and the micro LEDs in the case where the first and second contact electrodes are provided on one side of each of the micro LEDs.

In the case where the first and second contact electrodes are provided on one side of each of the micro LEDs, the inspection apparatus 1000' for inspecting whether the micro LEDs 100 are defective includes a first substrate 1300 located over the micro LEDs 100.

The upper substrate 1300 has upper electrodes 1310 provided on a lower surface thereof. Each of the upper electrodes 1310 is configured such that a lower surface thereof is in contact with an upper surface of the first contact electrode 106 of one of the micro LEDs 100 and with an upper surface of the second contact electrode 107 of an adjacent one of the micro LEDs 100 at positions on opposite sides thereof.

The upper electrodes 1310 are arranged such that the opposite sides of each thereof are alternately in contact with the first contact electrode 106 and the second contact electrode 107 of adjacent ones of the micro LEDs 100.

In other words, as shown in FIG. 4, the upper electrode 1310 arranged second from the left is configured such that the left lower surface thereof is in contact with the upper surface of the second contact electrode 107 of the micro LED 100 arranged first from the left, and the right lower surface thereof is in contact with the upper surface of the first contact electrode 106 of the micro LED 100 arranged second from the left.

It is preferable that the distance between the upper electrodes 1310 is equal to or greater than the distance between inner surfaces of the first and second contact electrodes 106 and 107 and is equal to or less than the distance between outer surfaces of the first and second contact electrodes 106 and 107.

The upper electrode 1310, which has the lower surface that is alternately in contact with the upper surfaces of the first and second contact electrodes 106 and 107 of the adjacent ones of the micro LEDs 100, serves to allow electricity to flow between the first and second electrodes 106 and 107 of the adjacent ones of the micro LEDs 100 when electricity is applied to the inspection apparatus 1000'.

The inspection apparatus 1000' having the above-described configuration inspects whether the micro LEDs 100 are defective in response to application of electricity to the inspection apparatus 1000'.

In detail, the micro LEDs 100 are arranged on the upper surface of a base substrate 1500 in m rows and n columns. In this case, the base substrate 1500 may be the growth substrate 10, the display substrate 301, or the carrier substrate described above. Alternatively, the base substrate 1500 may be the transfer head. In this case, FIG. 4 is regarded as an inverted view.

Thereafter, the upper substrate 1300 is lowered toward the micro LEDs 100, and the upper electrodes 1310 are brought into contact with the first and second contact electrodes 106 and 107 of respective adjacent ones of the micro LEDs 100.

When the first and second contact electrodes 106 and 107 of respective adjacent ones of the micro LEDs 100 are brought into contact with the opposite sides of the upper electrodes 1310, and when the micro LEDs 100 are interposed between the base substrate 1500 and the upper substrate 1300, electricity is applied to the first end of the inspection apparatus 1000'.

If all of the micro LEDs 100 on the inspection apparatus 1000' are normal, electricity sequentially repeatedly flows to the upper electrodes 1310, the first contact electrodes 106, the second contact electrodes 107, and the upper electrodes 1310, and electricity also flows to the second end of the inspection apparatus 1000', whereby all of the micro LEDs 100 are determined as normal products.

If at least one of the micro LEDs 100 on the inspection apparatus 1000' is defective, electricity does not flow. Accordingly, no electricity flows to the second end of the inspection apparatus 1000', whereby it is possible for the inspection apparatus 1000' to determine that a defective micro LED 100 exists in one column or one row.

The inspection apparatuses 1000 and 1000' described above may be configured to collectively inspect multiple rows (m rows) or multiple columns (n columns) of the micro LEDs.

For example, when the micro LEDs 100 are arranged in 1,000 rows and 1,000 columns, the inspection apparatuses 1000 and 1000' are configured to be able to inspect ten rows and ten columns of the micro LEDs, thus inspecting all of the micro LEDs 100 arranged in 1,000 rows and 1,000 rows through 100 inspections.

Alternatively, under the above conditions, the inspection apparatuses 1000 and 1000' may be configured to be able to inspect 1,000 rows and 1,000 columns of the micro LEDs, thus inspecting all of the micro LEDs 100 arranged in 1,000 rows and 1,000 rows through one inspection.

The description of the inspection apparatuses 1000 and 1000' is only an example of the inspection apparatuses 1000 and 1000' based on the case where the first and second contact electrodes 106 and 107 are provided on the opposite sides of each of the micro LEDs 100 and the case where the first and second contact electrodes 106 and 107 are provided on one side of each of the micro LEDs 100.

Thus, even if the configuration is different from that of the above-described inspection apparatuses 1000 and 1000', a line inspection apparatus which can determine whether the micro LEDs 100 arranged in m rows and n columns are defective micro LEDs 100 for each row or each column may be included in the inspection apparatuses 1000 and 1000' used in the inspection method for the micro LED 100 according to the embodiment of the present invention that will be described later.

Hereinbelow, the inspection method for the micro LED 100 according to the embodiment of the present invention will be described with reference to FIGS. 5A to 5C. In the following description, for convenience of explanation, the case where the micro LEDs 100 are arranged in five rows and five columns will be described.

Figure 5A:
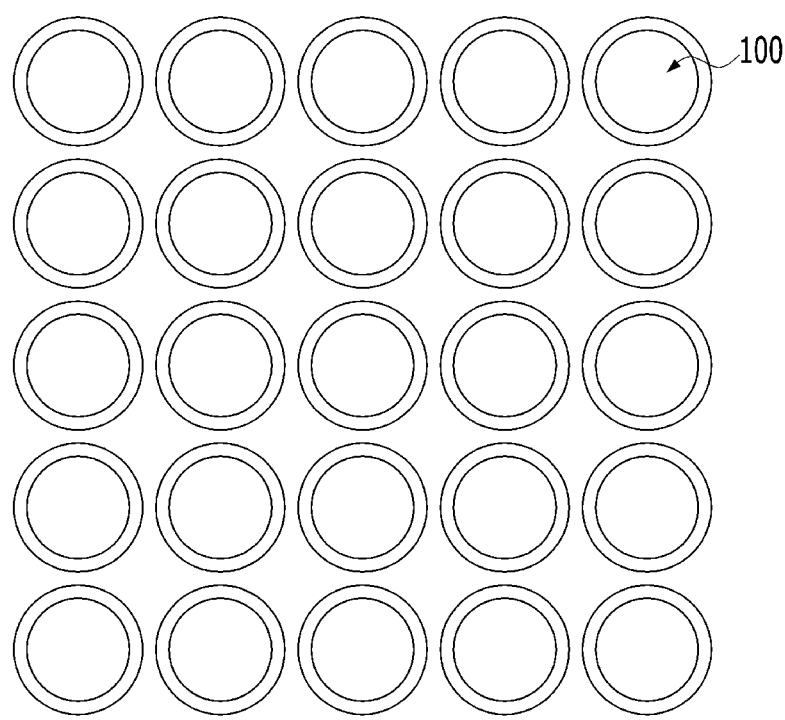
FIGS. 5A to 5C are views illustrating an inspection method for a micro LED according to an embodiment of the present invention.
Figure 5B:
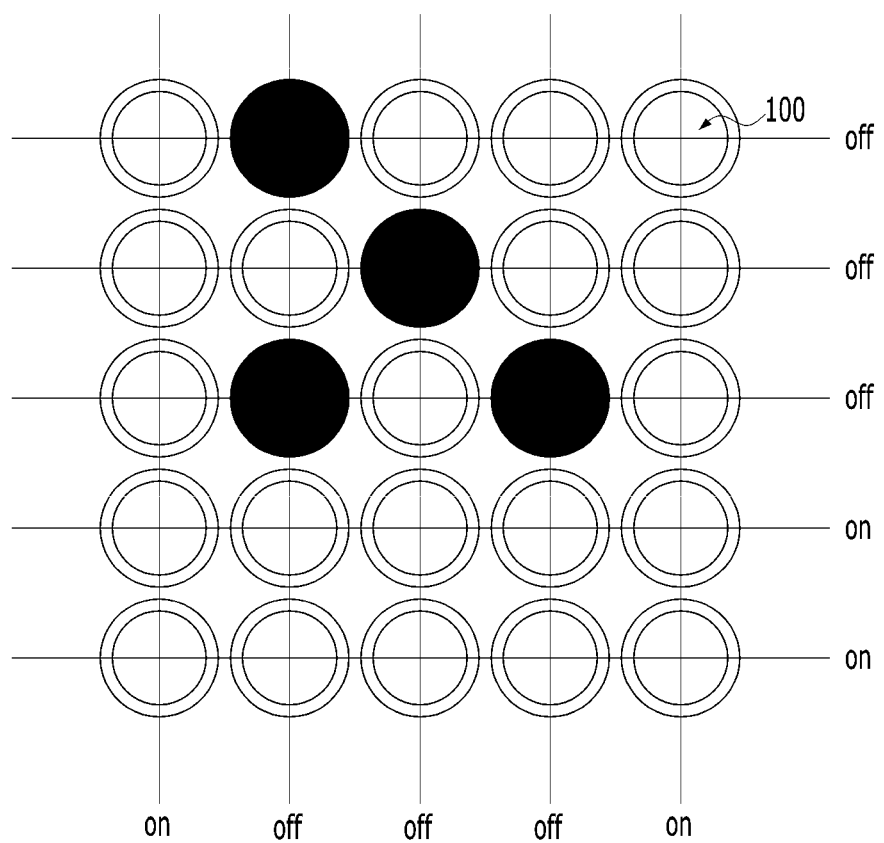
Figure 5C:
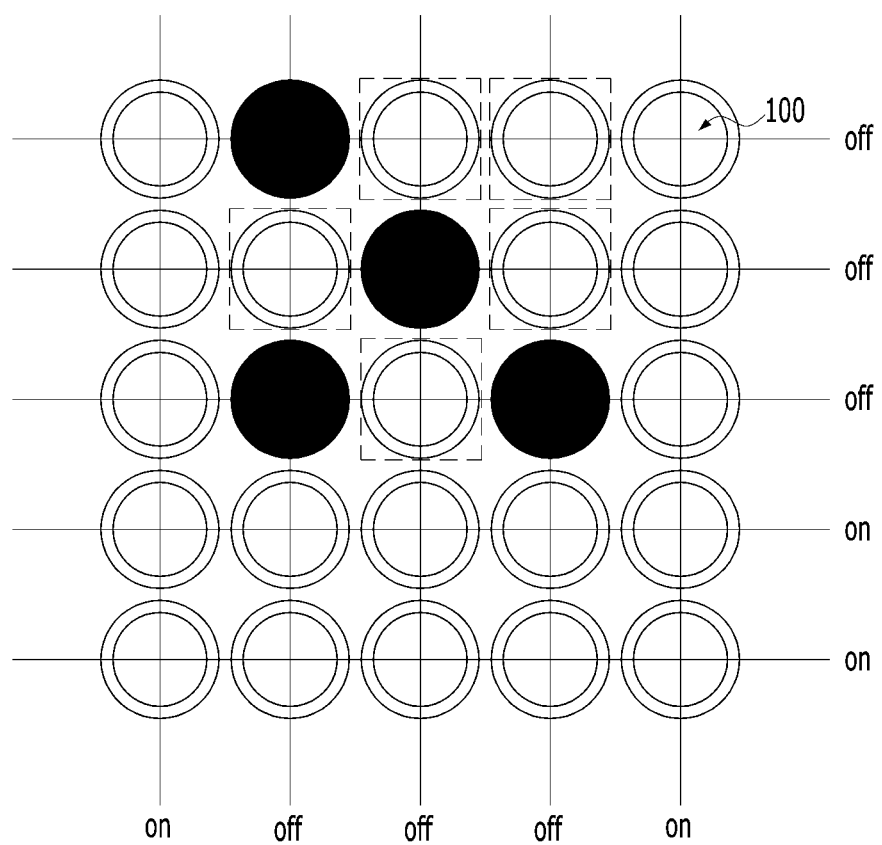

FIG. 5A is a view illustrating the micro LEDs 100 arranged in first to fifth rows and first to fifth columns, FIG. 5B is a view illustrating a result of inspecting first to fifth rows and first to fifth columns of the micro LEDs 100, and FIG. 5C is a view illustrating defective micro LEDs that are ascertained through FIG. 5B and indeterminable micro LEDs.

As shown in FIG. 5A, the micro LEDs 100 are arranged to be spaced apart from each other at regular intervals in multiple rows and multiple columns.

In this case, the micro LEDs 100 may be attached to or mounted on the growth substrate 101, the display substrate 301, or the carrier substrate, or may be gripped on the transfer head.

The inspection apparatuses 1000 and 1000' sequentially inspect the first to fifth rows of the micro LEDs 100 and then sequentially inspect the first to fifth columns of the micro LEDs 100. In this case, the inspection apparatuses 1000 and 1000' are line inspection apparatuses that perform the same inspection method as described above and can perform inspection for each line, that is, for each row and each column.

When it is determined through inspection by the inspection apparatuses 1000 and 1000' that only normal micro LEDs 100 exist in each row or each column, the inspection apparatuses 1000 and 1000' transmit an inspection signal of 'on' to a control unit.

In other words, in inspecting each row or each column, when the inspection signal transmitted to the control unit from the inspection apparatuses 1000 and 1000 is an 'on' signal, the control unit determines that only normal micro LEDs exist in each row or each column.

When it is determined through inspection by the inspection apparatuses 1000 and 1000' that even one defective micro LED 100 exists in each row or each column, the inspection apparatuses 1000 and 1000' transmit the inspection signal of 'off' to the control unit.

In other words, in inspecting each row or each column, when the inspection signal transmitted to the control unit from the inspection apparatuses 1000 and 1000' is an 'off' signal, the control unit determines that at least one defective micro LED 100 exists.

As shown in FIG. 5B, defective micro LEDs 100 are located at the coordinates of (1,2), (2,3), (3,2), and (3,4) (in this case, referred to as (m,n), m is the row, and n is the column).

As in the above-described line inspection method, even when electricity is applied to the first ends of the inspection apparatuses 1000 and 1000', electricity does not flow to the second ends of the inspection apparatuses 1000 and 1000' in the first to third rows. Accordingly, the inspection apparatuses 1000 and 1000' determine that at least one defective micro LED 100 exists in the first to third rows and transmit an inspection signal of 'off' to the controller.

In the fourth and fifth rows, when electricity is applied to the first ends of the inspection apparatuses 1000 and 1000', electricity flows to the second ends of the inspection apparatuses 1000 and 1000', whereby the inspection apparatuses 1000 and 1000' determine that only normal micro LEDs exist in the fourth and fifth rows. Accordingly, the inspection apparatuses 1000 and 1000' transmit the inspection signal of 'on' to the control unit.

Even when electricity is applied to the first ends of the inspection apparatuses 1000 and 1000' in the second to fourth columns, electricity does not flow to the second ends of the inspection apparatuses 1000 and 1000' in the first to third rows. Accordingly, the inspection apparatuses 1000 and 1000' determine that at least one defective micro LED 100 exists in the second to fourth columns and transmit the inspection signal of 'off' to the control unit.

In the first and fifth columns, when electricity is applied to the first ends of the inspection apparatuses 1000 and 1000', electricity flows to the second ends of the inspection apparatuses 1000 and 1000', whereby the inspection apparatuses 1000 and 1000' determine that only normal micro LEDs exist in the first and fifth columns. Accordingly, the inspection apparatuses 1000 and 1000' transmit the inspection signal of 'on' to the control unit.

As described above, when the results of inspection by the inspection apparatuses 1000 and 1000', that is, all the inspection signals for the first to fifth rows and the first to fifth columns are transmitted to the control unit, the control unit determines, when the inspection signal of each row is the 'off' signal and when the inspection signal of each column is the 'off' signal, all of the micro LEDs 100 at the corresponding positional coordinates as defective micro LEDs 100.

In other words, because the inspection signals for the first to third rows and the second to fourth columns are all the 'off' signals, the control unit determines all of the micro LEDs 100 located at the coordinates where the first to third rows and the second to fourth columns intersect as defective micro LEDs 100.

Thus, as shown in FIG. 5C, the control unit determines the micro LEDs 100 at the coordinates of (1,2), (1,3), (1,4), (2,2) (2,3), (2,4), (3,2), (3,3), and (3,4) as defective micro LEDs 100, and the defective micro LEDs 100 at the corresponding coordinates are replaced with normal micro LEDs 100 by a removal apparatus and a replacement apparatus.

According to the inspection method for the micro LED 100 described above, the following effects are obtained.

In the case of a conventional LED, multiple LEDs placed on a substrate are all inspected for defects by using a probe detection needle or the like. However, the micro LED 100 has a very small size as compared with the conventional LED, causing a problem that in the case of defect inspection as in the conventional LED, it is necessary to inspect a very large number of micro LEDs 100. In other words, in the case of the micro LEDs arranged in 1,000 rows and 1,000 columns, the inspection apparatuses 1000 and 1000' have to inspect 1,000,000 micro LEDs 100.

However, in the present invention, it is determined whether defective micro LEDs 100 exist for each line, whereby it is possible to determine whether a defective product exists through a total of 2,000 inspections including 1,000 inspections for the rows and 1,000 inspections for the columns.

Furthermore, even when normal micro LEDs 100, which are not originally defective products, are determined as defective products (referred to as the micro LEDs 100 at the coordinates of (1,3), (1,4), (2,2), (2,4), and (3,3) in FIG. 5C), the yield of the micro LEDs 100 is 99.9%, which is a very small value.

As described above, through the inspection method for the micro LED 100 according to the present invention, it is possible to determine whether the micro LEDs 100 are defective by a very small number of inspections and a simple inspection.

According to the inspection method for the micro LED 100 according to the embodiment of the present invention, when the inspection signal of each row is the 'off' signal and when the inspection signal of each column is the 'off' signal, the micro LEDs 100 at the corresponding positional coordinates are re-inspected.

In other words, in FIG. 5B, when the inspection signals for each row and each column are transmitted to the control unit, the control unit precisely re-inspects the micro LEDs 100 at the coordinates of (1,2), (1,3), (1,4), (2,2), (2,3), (2,4), (3,2), (3,3), and (3,4) to determine only defective micro LEDs 100. In this case, the precise inspection is performed by an individual inspection apparatus rather than the line inspection apparatus.

As described above, defective micro LEDs 100 are precisely re-inspected by the individual inspection apparatus, whereby the micro LEDs 100 that cannot be determined for defects by the line inspection apparatus, that is, the micro LEDs 100 at the coordinates of (1,3), (1,4), (2,2), (2,4), and (3,3) are re-inspected and determined as normal micro LEDs 100. Thus, it is possible to more precisely determine defective micro LEDs 100 and normal micro LEDs 100.

It is preferable that such re-inspection is used in the micro LEDs 100 to be used in a very large display. This is because, in the case of a very large display, the number of the micro LEDs 100 to be used is large, and thus even when the yield is 99.9%, when normal micro LEDs 100 are determined as defective products, the number thereof is large.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An inspection method for a micro LED, the method comprising:
    sequentially inspecting first to m-th rows of micro LEDs;
    sequentially inspecting first to n-th columns of the micro LEDs; and
    determining positional coordinates of a defective micro LED through the inspecting of the first to m-th rows and the first to n-th columns of the micro LEDs.

2. The method of claim 1, wherein in the inspecting of each of the first to m-th rows or each of the first to n-th columns of the micro LEDs, when an inspection signal is an 'on' signal, it is determined that only normal micro LEDs exist in the each row or the each column.

3. The method of claim 1, wherein in the inspecting of each of the first to m-th rows or each of the first to n-th columns of the micro LEDs, when an inspection signal is an 'off' signal, it is determined that at least one defective micro LED exists in the each row or the each column.

4. The method of claim 1, wherein when an inspection signal of each row is an 'off' signal and an inspection signal of each column is an 'off' signal, it is determined that all of the micro LEDs at corresponding positional coordinates are defective micro LEDs.

5. The method of claim 1, wherein when an inspection signal of each row is an 'off' signal and an inspection signal of each column is an 'off' signal, the micro LEDs at corresponding positional coordinates are re-inspected.

* * * * *